United States Patent
Luk (10) Patent No.: US 11,552,703 B2
(45) Date of Patent: Jan. 10, 2023

(54) DETECTING POWER OF LOW-BANDWIDTH AND BROAD-BANDWIDTH OPTICAL SIGNALS

(71) Applicant: Ciena Corporation, Hanover, MD (US)

(72) Inventor: Tom Luk, Ottawa (CA)

(73) Assignee: Ciena Corporation, Hanover, MD (US)

(*) Notice: Subject to any disclaimer, the term of this patent is extended or adjusted under 35 U.S.C. 154(b) by 225 days.

(21) Appl. No.: 17/116,461

(22) Filed: Dec. 9, 2020

(65) Prior Publication Data

US 2022/0182140 A1 Jun. 9, 2022

(51) Int. Cl.
*H04B 10/079* (2013.01)
*H03G 3/30* (2006.01)
*H03M 1/12* (2006.01)

(52) U.S. Cl.
CPC ........ *H04B 10/0797* (2013.01); *H03G 3/3036* (2013.01); *H03M 1/12* (2013.01)

(58) Field of Classification Search
CPC ................. H04B 10/0797; H04B 10/66–6973
See application file for complete search history.

(56) References Cited

U.S. PATENT DOCUMENTS

| | | | |
|---|---|---|---|
| 6,188,737 B1 | 2/2001 | Bruce et al. | |
| 6,980,140 B1 | 12/2005 | Rowland et al. | |
| 8,126,332 B2 | 2/2012 | Bainbridge et al. | |
| 8,170,074 B2 | 5/2012 | Cao | |
| 8,306,419 B2 | 11/2012 | Luk et al. | |
| 8,306,422 B2 | 11/2012 | Bainbridge et al. | |
| 10,594,281 B1 | 3/2020 | Luk et al. | |
| 10,658,994 B2 | 5/2020 | Luk et al. | |
| 10,715,169 B1 | 7/2020 | Aouini et al. | |
| 2002/0018272 A1* | 2/2002 | Grandpierre | H04B 10/66 398/202 |
| 2002/0048069 A1* | 4/2002 | Ibukuro | H04B 10/673 398/140 |
| 2003/0185258 A1 | 10/2003 | Dyer et al. | |
| 2004/0030965 A1 | 2/2004 | Hadjihassan et al. | |
| 2009/0252504 A1* | 10/2009 | Noda | H03F 3/08 398/202 |
| 2010/0021164 A1 | 1/2010 | Luk et al. | |
| 2010/0129077 A1 | 5/2010 | Bainbridge et al. | |
| 2018/0234096 A1* | 8/2018 | Li | H03K 17/941 |

FOREIGN PATENT DOCUMENTS

| | | |
|---|---|---|
| EP | 3 145 098 B1 | 3/2018 |
| EP | 3 166 238 B1 | 5/2020 |

\* cited by examiner

*Primary Examiner* — Nathan M Cors
(74) *Attorney, Agent, or Firm* — Clements Bernard Baratta; Lawrence A. Baratta, Jr.; Christopher L. Bernard (57) ABSTRACT

Optical network devices, optical receivers, Automatic Gain Control (AGC) circuits, and power detection systems are provided for detecting power of optical signals within an optical communication system. An optical network device, according to one implementation, includes a receiver configured to receive an optical signal. The optical network device also includes a low bandwidth path configured to detect a low-band power component of the optical signal within a channel of interest and a broad bandwidth path arranged in parallel with the low bandwidth path. The broad bandwidth path is configured to detect a broad-band power component of the optical signal within broad-band channels including at least the channel of interest. A power detection output is derived from the low-band power component and the broad-band power component.

20 Claims, 7 Drawing Sheets

DETECTING POWER OF LOW-BANDWIDTH AND BROAD-BANDWIDTH OPTICAL SIGNALS

TECHNICAL FIELD

The present disclosure generally relates to optical network systems and methods. More particularly, the present disclosure relates to detecting power of optical signals in a channel of interest and in an adjacent channel.

BACKGROUND

Conventional optical receivers typically include only one digital power detector after an Analog-to-Digital Converter (ADC). The digital power detector may include a power monitor bandwidth up to approximately the Nyquist frequency. Typically, there are ways to re-center an Automatic Gain Control (AGC) loop via performance parameters discovered in a Digital Signal Processor (DSP). However, this process is slow, and it cannot compensate and re-adjust AGC targets during input signal transients. Some commercial DSPs have a very rudimentary power detector and are not particularly accurate or precise. A problem exists in that these concepts are traditionally the only options in the field of optical receivers.

Figure 1:
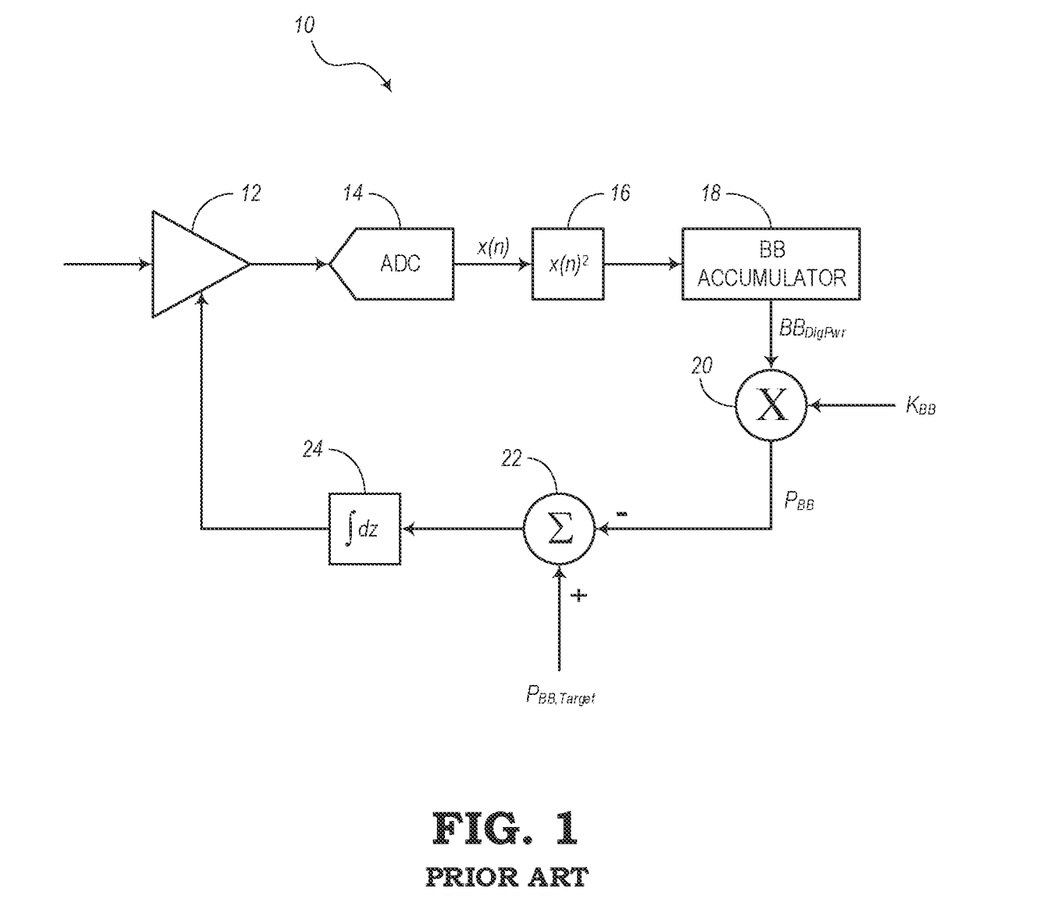
FIG. 1 is a schematic diagram of a conventional AGC loop used for power detection in an optical system.

FIG. 1 is a schematic diagram of a conventional AGC loop 10 used for power detection in an optical system. A receiver 12 is configured to receive optical signals. An ADC 14 converts the analog optical signals to digital samples. A squaring device 16 and Broad-Band (BB) accumulator 18 are configured to detect the power of the received optical signal. This power reported may be applied to an AGC loop that includes a multiplier 20, summer 22, and integrator 24. The AGC loop includes a feedback signal to the receiver 12. Thus, the AGC loop is configured to set the Rx gain properly to fill the ADC input.

Figure 2A:
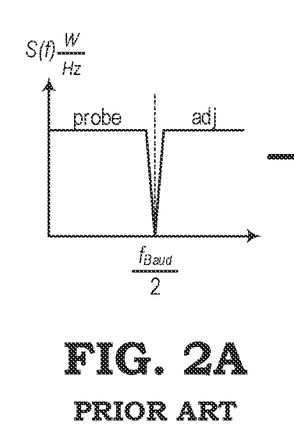
FIGS. 2A-2C are graphs showing sampled power versus frequency for a channel of interest and a channel adjacent to the channel of interest in a conventional system.
Figure 2B:
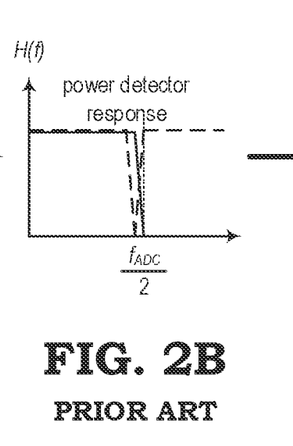
Figure 2C:
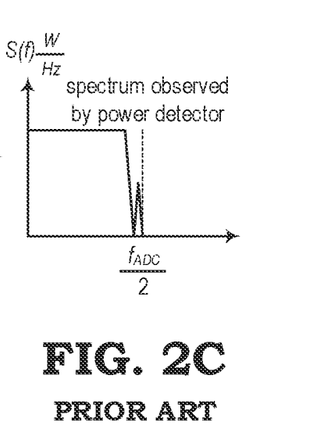

FIGS. 2A-2C are graphs showing sampled power versus frequency for a channel of interest and a channel adjacent to the channel of interest. The adjacent channel has a band of frequencies greater than the channel of interest. The receiver 12 may have a bandwidth ($BW_{Electrical}$). The ADC 14 may have a Nyquist frequency $$\left(\frac{f_{ADC}}{2}\right)$$

and is closely matched to the input target signal bandwidth $$\left(\frac{f_{Baud}}{2}\right).$$

Even when an adjacent channel is present, the adjacent channel's signal is largely not detected by the receiver 12 of the power detector.

Figure 3A:
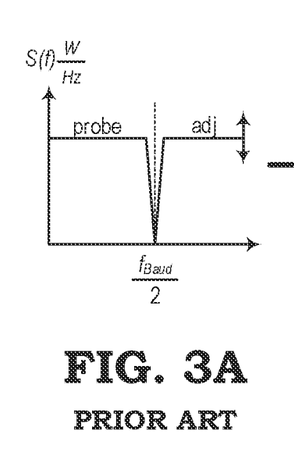
FIGS. 3A-3C are graphs showing sampled power versus frequency of the channel of interest and the adjacent channel in a conventional system.
Figure 3B:
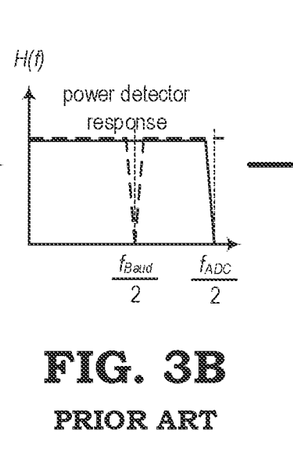
Figure 3C:
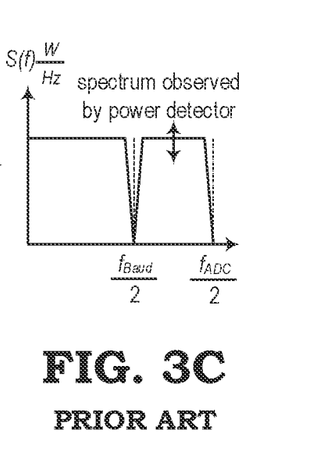

FIGS. 3A-3C are graphs showing sampled power versus frequency of the channel of interest and the adjacent channel. When the receiver bandwidth $$(BW_{Electrical})$$

and ADC Nyquist frequency $$\left(\frac{f_{ADC}}{2}\right)$$

are greater man me input target signal bandwidth $$\left(\frac{f_{Baud}}{2}\right),$$

a single power detector will observe both the target signal power and a portion of the adjacent channel power. In this case, the power detector reports different power depending on the presence and the power spectrum level of the adjacent channel;

$$P_{PwrDet} = \int_0^{\frac{f_{ADC}}{2}} S_{Probe}(f)df + \int_0^{\frac{f_{ADC}}{2}} S_{Adjacent}(f)df.$$

Another shortcoming of the conventional systems is that a single power detector cannot discriminate between the signal power of a channel of interest and an adjacent channel. Therefore, with the receiver (Rx) AGC loop locking onto a fixed target, the signal power at the ADC input can vary depending on the adjacent channel power appearing at the ADC input. Therefore, there is a need in the field of optical receivers, AGC circuits, and power detection systems to overcome the deficiencies of the conventional systems.

BRIEF SUMMARY

According to one embodiment of the present disclosure, an optical network device includes a receiver configured to receive an optical signal. The optical network device also includes a low bandwidth path configured to detect a low-band power component of the optical signal within a channel of interest and a broad bandwidth path arranged in parallel with the low bandwidth path. The broad bandwidth path is configured to detect a broad-band power component of the optical signal within broad-band channels including at least the channel of interest. A power detection output is derived from the low-band power component and the broad-band power component.

According to another embodiment of the present disclosure, an Automatic Gain Control (AGC) circuit includes a receiver configured to receive an optical signal, a low bandwidth path, and a broad bandwidth path. The low bandwidth path is configured to detect a low-band power component of the optical signal within a channel of interest. The broad bandwidth path, arranged in parallel with the low bandwidth path, is configured to detect a broad-band power component of the optical signal within broad-band channels including at least the channel of interest. A power detection output is derived from the low-band power component and the broad-band power component.

According to yet another embodiment of the present disclosure, a power detection system includes a receiver configured to receive an optical signal, a low bandwidth path configured to detect a low-band power component of the optical signal within a channel of interest, and a broad bandwidth path arranged in parallel with the low bandwidth path. The broad bandwidth path is configured to detect a broad-band power component of the optical signal within broad-band channels including at least the channel of interest. A power detection output is derived from the low-band power component and the broad-band power component.

BRIEF DESCRIPTION OF THE DRAWINGS

The present disclosure is illustrated and described herein with reference to the various drawings. Like reference numbers are used to denote like components/steps, as appropriate. Unless otherwise noted, components depicted in the drawings are not necessarily drawn to scale.

DETAILED DESCRIPTION

The present disclosure relates to systems and methods for detecting power of optical signals transmitted within an optical system. Optical receivers and other optical network devices, according to embodiments of the present disclosure, are configured to receive these optical signals and determine power. For example, the optical receivers may be configured as colorless (e.g., capable of receiving a broad range of channels (or colors)) receivers. The optical receivers may also be configured as coherent receivers. In addition to detecting optical power, the power detection systems may include an Automatic Gain Control (AGC) feedback path for controlling the gain of an optical receiver.

According to various implementations of the present disclosure, the power detection systems may include two parallel paths for detecting optical power. A first path may be a low-bandwidth path for detecting power of a channel of interest. For example, the "channel of interest" may also be referred to as a provisioned channel, a desired channel, a target channel, a probe channel, or other suitable terminology. A second path may be a broad-bandwidth path for detecting power of one or more channels, including the channel of interest and at least one channel that is adjacent to the channel of interest. The "adjacent channel" may also be referred to as an "out-of-band" channel. The adjacent channel may be viewed as carrying an interfering power component. AGC compensation can be applied to reduce power on account of the interfering power component of the adjacent channel.

With the dual power detection for detecting low-bandwidth and broad-bandwidth signals, the AGC loop can set the receiver gain to optimally fill an Analog-to-Digital Converter (ADC) of the optical power detectors with the signal power of the channel of interest. When the adjacent channel power is below a threshold, the target signal (signal at the channel of interest) at ADC input is optimal. When the adjacent channel power is above the threshold, the target signal at ADC input can be lowered by the AGC feedback control. Although this may seem like a compromise in some respects, this arrangement can prevent the Rx AGC from overloading the ADC. Thus, the embodiments of power detectors of the present disclosure can detect the power of the channel of interest (e.g., provisioned channel) and the power of an adjacent channel. Again, these power detectors, according to some embodiments, may comprise two sub-detectors having different signal bandwidth.

The embodiments of the present disclosure are described in terms of s a "digital" power detector implementation. However, it should be noted that the same functionality can be accomplished with an "analog" power detector. Also, instead of dual paths, some embodiments may include a single detection path with a "time-multiplexing" feature in which a Low-Pass Filter (LPF) is switched on and off to provide low-bandwidth detection when the LPF is on and provide a broad-bandwidth detection when the LPF is off. This alternative embodiment may be used as a single power detector device.

Also, the functionality of power detection and gain control can be implemented in hardware as digital power detector components and digital AGC components. The AGC Loop can maintain optimal ADC fill even during fast input signal transients.

There has thus been outlined, rather broadly, the features of the present disclosure in order that the detailed description may be better understood, and in order that the present contribution to the art may be better appreciated. There are additional features of the various embodiments that will be described herein. It is to be understood that the present disclosure is not limited to the details of construction and to the arrangements of the components set forth in the following description or illustrated in the drawings. Rather, the embodiments of the present disclosure may be capable of other implementations and configurations and may be practiced or carried out in various ways. Also, it is to be understood that the phraseology and terminology employed are for the purpose of description and should not be regarded as limiting.

As such, those skilled in the art will appreciate that the inventive conception, upon which this disclosure is based, may readily be utilized as a basis for the designing of other structures, methods, and systems for carrying out the several purposes described in the present disclosure. Those skilled in the art will understand that the embodiments may include various equivalent constructions insofar as they do not depart from the spirit and scope of the present invention. Additional aspects and advantages of the present disclosure will be apparent from the following detailed description of exemplary embodiments which are illustrated in the accompanying drawings.

Figure 4:
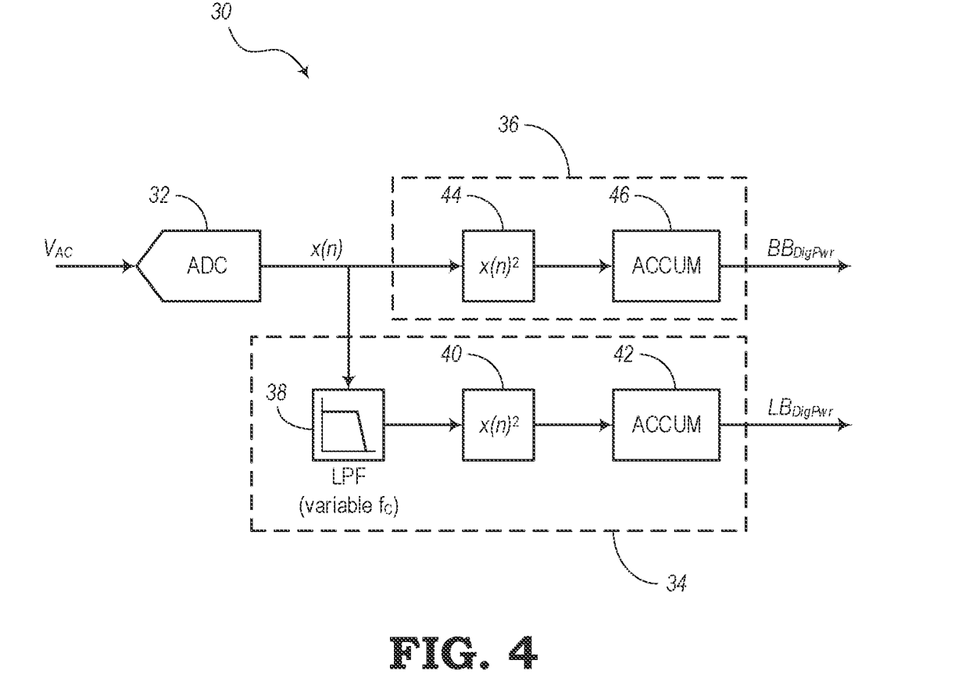
FIG. 4 is a schematic diagram illustrating a dual path detector for detecting a low-bandwidth power component and a broad-bandwidth power component, according to various embodiments of the present disclosure.

FIG. 4 is a schematic diagram illustrating an embodiment of a dual path detector 30 for detecting a low-bandwidth power component and a broad-bandwidth power component. The dual path detector 30 may be incorporated in an optical receiver or other suitable optical network device, network element, etc. For example, the dual path detector 30 may be part of an optical receiver associated with a modem, a Reconfigurable Optical Add/Drop Multiplexer (ROADM) device, or other Wavelength Division Multiplexing (WDM) device of an optical communication system.

The dual path detector 30 may include a receiver or detector element configured to receive an optical signal. The receiver may be configured to receive coherent colorless optical signals from another card or node in an optical communication system. The received optical signal can be provided to an ADC device 32, which may be configured to convert the received optical signal to digital signal samples. These digital signal samples may be applied to a low bandwidth path 34 and a broad bandwidth path 36, which may be arranged in parallel with each other. In the context of optical networks, the ADC device 32 in this embodiment may be configured to sample the received optical signal at or about 50 G samples or bits per second (i.e., at or about 50 GBaud), a rate higher than 50 GBaud, or other suitable sampling rates.

The low bandwidth path 34 may include a Low-Pass Filter (LPF) 38, a first squaring function element 40, and a first accumulating device 42. The LPF 38 may be configured to pass frequencies within the desired band of frequencies of the desired channel (or "channel of interest"). Also, the LPF 38 may include a programmable cut-off frequency for defining the bandwidths of the channel of interest. The first squaring function element 40 and the first accumulating device 42 may be configured to square and combine the samples to provide a low-band power component at an output of the low bandwidth path 34. Similarly, the broad bandwidth path 36 may include a second squaring function element 44 and a second accumulating device 46 to provide a broad-band power component at an output of the broad bandwidth path 36. The squaring function elements 40, 44 in combination with the accumulating devices 42, 46 may be used in a process to compute a Root Mean Squared (RMS) expression for different paths 34, 36.

The dual path detector 30 is therefore configured to detect the low-band power component of the optical signal within the channel of interest and the broad-band power component of the optical signals within a channel adjacent to the channel of interest. The broad bandwidth path 36 is configured to detect the broad-band power component of the optical signal within broad-band channels including at least the channel of interest. A power detection output may be derived from the combination of the low-band power component and the broad-band power component.

The ADC device 32 provides samples x(n), which are discrete ADC digital samples in units of Least Significant Bits (LSB). The squaring function elements 40, 44 are configured to square the ADC digital sample $x(n)^2$ and the results are added in the accumulating devices 42, 46. The accumulating devices 42, 46 are configured to accumulate N number of $x(n)^2$ samples and output the accumulated value at the output of the respective path 34, 36. The accumulating devices 42, 46 are then reset to zero to start a new accumulation cycle.

The ADC input magnitude in digital format can be computed as $$LSB_{RMS} = \sqrt{\frac{\sum_{n=1}^{N} x(n)^2}{N}}.$$

The ADC input power in digital format can be computed as $$LSB_{RMS}^2 = \frac{\sum_{n=1}^{N} x(n)^2}{N}.$$

There are two digital power detectors following the ADC device 32.

AGC Loop with Signal Over-Sampling

To preserve the fidelity of the ADC and the performance of a Digital Signal Processing (DSP) performing the digital operations of the optical receiver, an Automatic Gain Control (AGC) loop may be added to a power detector (e.g., added to the duel path detector 30). The AGC loop may monitor the ADC $LSB_{RMS}^2$ detected by the power detector and controls the gain of the receiver to maintain an optimum ADC input power.

In applications where the signal bandwidth $$\left(\frac{f_{Baud}}{2}\right)$$

is lower than the ADC Nyquist bandwidth $$\left(\frac{f_{ADC}}{2}\right),$$

i.e. the signal is over-sampled as in 32 GBaud $$\left(\frac{f_{Baud}}{2} = 16\,\text{GHz}\right)$$

with a receiver optical-to-electrical bandwidth of about 35-40 GHz and a processor ADC speed of about 78 G samples per second $$\left(\frac{f_{ADC}}{2} = 39\,\text{GHz}\right),$$

managing me gain of the receiver can becomes more complicated. The following embodiments of the present disclosure are configured to achieve these specifications.

For a signal that has a bandwidth that is approximately the same as the ADC Nyquist bandwidth, there is an optimum ADC fill target for this Broad Bandwidth (BB) signal, $LSB_{RMS,BB}$. For a signal that has a bandwidth lower than the ADC Nyquist bandwidth, the ADC fill target of this Low Bandwidth (LB) signal can be $LSB_{RMS,LB} \leq LSB_{RMS,BB}$. Setting the ADC fill target for the low bandwidth signal depends on the presence (or absence) of the adjacent channel and the power of the adjacent channel (when present).

The reason that this may be a complicated problem is described here. If the receiver only receives the low bandwidth target signal (i.e., there is no adjacent channels present), one can set the receiver gain such that the low bandwidth signal level at the ADC input equals to the optimum and maximum magnitude, $LSB_{RMS,BB}$. However, when the receiver accepts both the low bandwidth target signal and the adjacent channel, the adjacent channel signal level appearing at the ADC input needs to be considered. Furthermore, the power or power spectral density (S) of the adjacent channel could be lower or higher than the target signal.

The signal detected on the channel of interest may be referred to as an operating signal.

$$S(f) \frac{w}{\text{Hz}}$$

is the Power Spectral Density as a function of frequency.

$$P = \int_{f_1}^{f_2} S(f) df$$

where P is the power integrated over $S(f)$ from $f_1$ to $f_2$.

Figure 5A:
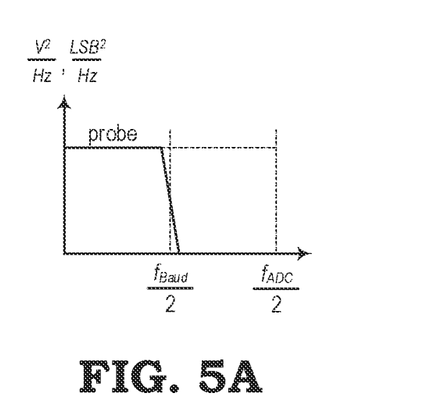
FIG. 5A is a graph of power spectral density (S) versus frequency and shows a low bandwidth signal only of the channel of interest of the dual path detector of FIG. 4, according to various embodiments.
Figure 5B:
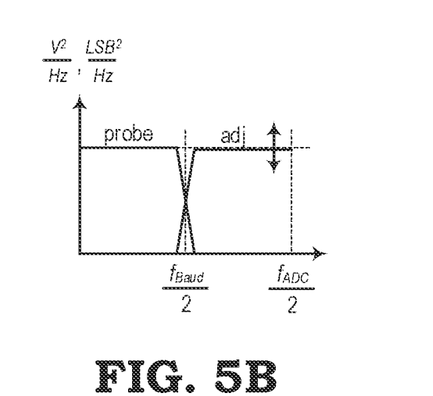
FIG. 5B is a graph showing a broad bandwidth signal at the channel of interest plus an adjacent channel of the dual path detector of FIG. 4, according to various embodiments.

FIG. 5A is a graph of power spectral density (S) versus frequency and shows a low bandwidth signal only of the channel of interest. FIG. 5B is a graph showing a broad bandwidth signal at the channel of interest plus an adjacent channel. The power spectral density (S) at the input of the ADC can be represented in either analog format $$\frac{V^2}{\text{Hz}}$$

or digital format $$\frac{LSB^2}{\text{Hz}}.$$

For this description, only the digital format is considered.

When the optical signal of the channel of interest and adjacent channel have the same input power spectral density as shown in FIG. 5B, the condition may be referred to as a "threshold" condition. The ADC power of the signal at the channel of interest is:

$$LSB_{RMS,Sig}^2 = LSB_{RMS,ADC}^2 \cdot \frac{f_{Baud}}{f_{ADC}} \quad [\text{Eq. 1}]$$

The ADC power of the signal at the adjacent channel is:

$$LSB_{RMS,Adj}^2 = LSB_{RMS,ADC}^2 \cdot \left(1 - \frac{f_{Baud}}{f_{ADC}}\right) \quad [\text{Eq. 2}]$$

where $LSB_{RMS,ADC}^2$ is the total ADC input digital power.

Setting the Gain of the Receiver

A definition of variables and other information is provided below:

$LSB_{RMS,BB,Target}^2$ is the ADC digital power target for the broad bandwidth signal.

$LSB_{RMS,LB,Target}^2$ is the ADC digital power target for the low bandwidth signal.

BB_DigPwr is the broad bandwidth digital power detector output which accumulates the power of every ADC samples.

LB_DigPwr is the low bandwidth digital power detector output which accumulates the power of the ADC samples that have been low-pass filtered.

$LSB_{RMS,BB}^2 = K_{BB} \cdot BB\_DigPwr$ is the ADC digital power of broad bandwidth signal $LSB_{RMS,LB}^2 = K_{LB} \cdot LB\_DigPwr$ is the ADC digital power of low bandwidth signal $LSB_{RMS,Adj}^2 = LSB_{RMS,BB}^2 - LSB_{RMS,LB}^2$ is the ADC digital power of adjacent channel Both $K_{BB}$ and $K_{LB}$ are constants that may be determined by design and experimentation.

For the case when the adjacent channel's power spectral density is less than or equal to that of the channel of interest, the AGC Loop sets the receiver gain such that the LB_DigPwr output locks onto $LSB_{RMS,LB,Target}$ as follows:

$$\frac{LB\_DigPwr}{K_{LB}} = LSB_{RMS,LB}^2 \overset{AGC}{\iff} LSB_{RMS,LB,Target}^2 = \quad [\text{Eq. 1}]$$

$$LSB_{RMS,BB,Target}^2 \cdot \frac{f_{Baud}}{f_{ADC}}, \text{ as in}$$

The logic on why the channel of interest fills the ADC to the same power spectral density as for a broad bandwidth signal is to allow for the presence of the adjacent channel. This maintains a stable DSP operation whether the adjacent channel is present or not.

However, for the case when adjacent channel's power spectral density is greater than that of the channel of interest, the AGC Loop sets the receiver gain lower than case 1 above such that the ADC will not over-fill and to avoid clipping. This is an acceptable compromise since the DSP is more capable to mitigate lower SNR (linear) than clipping (non-linear) condition.

By knowing the target signal ADC digital power ($LSB_{RMS,LB}^2$) and the broad bandwidth ADC digital power ($LSB_{RMS,BB}^2$), the AGC Loop can re-center the receiver gain when the adjacent channel ADC digital power ($LSB_{RMS,Adj}^2 = LSB_{RMS,BB}^2 - LSB_{RMS,LB}^2$) crosses a predetermined threshold ($LSB_{RMS,adj,Threshold}^2$). Thus, $$LSB_{RMS,LB}^2 + \max(0, LSB_{RMS,Adj}^2 - LSB_{RMS,AdjThreshold}^2) \quad \text{Eq. [3]}$$

$$\overset{AGC}{\iff} LSB_{RMS,LB,Target}^2$$

where $$LSB_{RMS,Adj,Threshold}^2 = LSB_{RMS,BB,Target}^2 \left(1 - \frac{f_{Baud}}{f_{ADC}}\right) \quad [\text{Eq. 2}]$$

By inspecting the above equation Eq. [3], when $LSB_{RMS,Adj}^2 \leq LSB_{RMS,Adj,Threshold}^2$ as for case 1, the AGC Loop sets the gain such that $$LSB_{RMS,LB}^2 \overset{AGC}{\Longleftrightarrow} LSB_{RMS,LB,Target}^2.$$

When the adjacent channel power is the same or less than the threshold power, the AGC Loop sets the receiver gain such that the target signal power equals to its target, $LSB_{RMS,LB,Target}^2$. When $LSB_{RMS,Adj}^2 > LSB_{RMS,Adj,Threshold}^2$ as for Case 2, the AGC Loop sets the gain such that $$LSB_{RMS,LB}^2 + (LSB_{RMS,Adj}^2 - LSB_{RMS,Adj,Threshold}^2) \overset{AGC}{\Longleftrightarrow} LSB_{RMS,LB,Target}^2$$

When the adjacent channel power is above the threshold power, the AGC Loop set the receiver gain such that the target signal power plus the excess adjacent channel power will not overfill the ADC. The resulting receiver gain will be lower than that of case 1.

Dual Low-Bandwidth (LB) and Broad-Bandwidth (BB) Power Detectors

Figure 6A:
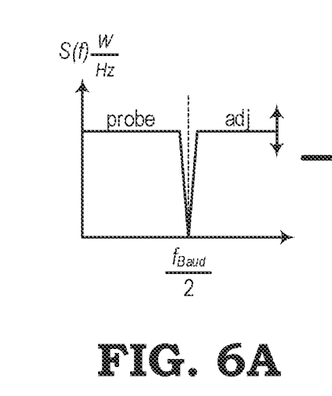
FIGS. 6A-6C are graphs showing spectral density versus frequency for a channel of interest and adjacent channel, according to various embodiments.
Figure 6B:
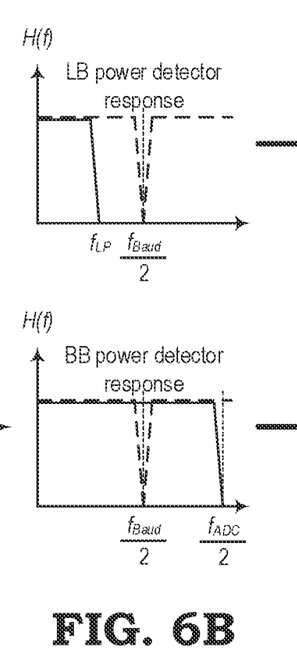
Figure 6C:
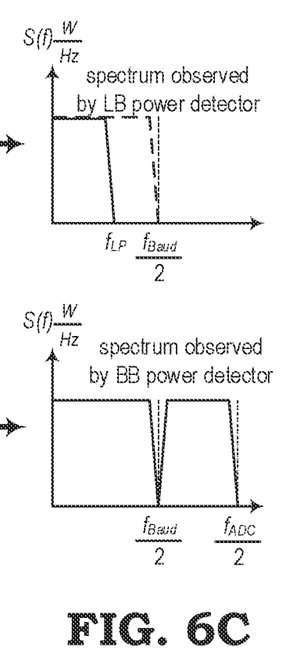

FIGS. 6A-6C are graphs showing spectral density versus frequency for a channel of interest and adjacent channel. The BB power detector reports the total power of the target signal (of the channel of interest) and the adjacent signal (of the adjacent channel):

$$BB_{PwrDet} = \int_0^{\frac{f_{ADC}}{2}} S_{Probe}(f)df + \int_0^{\frac{f_{ADC}}{2}} S_{Adjacent}(f)df \text{ and } P_{BB} = K_{BB} \cdot BB_{PwrDet}$$

Expected $K_{BB}=1$.

The LB power detector reports a portion of the target signal power; $LB_{PwrDet} = \int_0^{f_{LP}} S_{Probe}(f)df$ and $P_{LB} = K_{LB} \cdot LB_{PwrDet}$. The value $K_{LB}$ is determined experimentally, $$K_{LB} \approx \frac{f_{Baud}}{2 \cdot f_{LP}}.$$

Optimizing ADC Input Power (ADC Fill)

Figure 7:
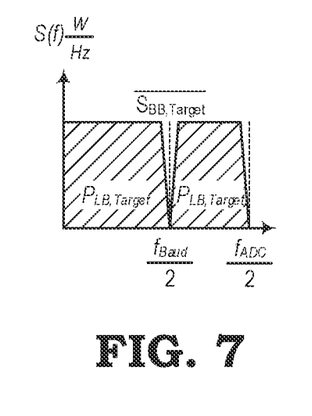
FIG. 7 is a graph showing the spectral density of a channel of interest (or target channel), according to various embodiments.

FIG. 7 is a graph showing the spectral density of a channel of interest (or target channel). It should be noted that the term "optimizing," when referring to values or levels of the ADC input power or other parameters, does not necessarily involve determining a single ideal value or level, but instead may refer to modifying previous values or levels for improvement thereof. Also, the term "optimum" does not necessarily include one single ideal value or level, but instead may be a value that is an improvement over previous values.

When the ADC input signal has a bandwidth $$\left(\frac{f_{Baud}}{2}\right)$$

that is closely matched to the ADC Nyquist frequency $$\left(\frac{f_{ADC}}{2}\right),$$

there is an optimum ADC input power ($P_{BB,Target}$) and optimum average ADC input power spectral density ($\overline{S_{BB,Target}}$) for this broad-bandwidth (BB) signal to achieve optimum operating Signal-to-Noise Ratio (SNR) and SDR performance.

$$\overline{S_{BB,Target}} = \frac{PP_{BB,Target}}{f_{ADC/2}}$$

One objective of the AGC with LB and BB power detection is to maintain a constant ADC input power spectral density at $\overline{S_{BB,Target}}$ for a low-bandwidth (LB) signal with or without an adjacent channel. When only the LB signal is present, the ADC input power should be:

$$P_{LB,Target} = \overline{S_{BB,Target}} \cdot \frac{f_{LB,Baud}}{2} = P_{BB,Target} \frac{f_{LB,Baud}}{f_{ADC}}$$

When an adjacent channel is present along with the LB signal, there exists an allowable adjacent power threshold to keep the power spectral density of both the LB signal and the adjacent channel at $\overline{S_{BB,Target}}$.

$$P_{Adj,Threshold} = P_{BB,Target} - P_{LB,Target} = P_{BB,Target} \cdot \left(1 - \frac{f_{LB,Baud}}{f_{ADC}}\right)$$

Figure 8:
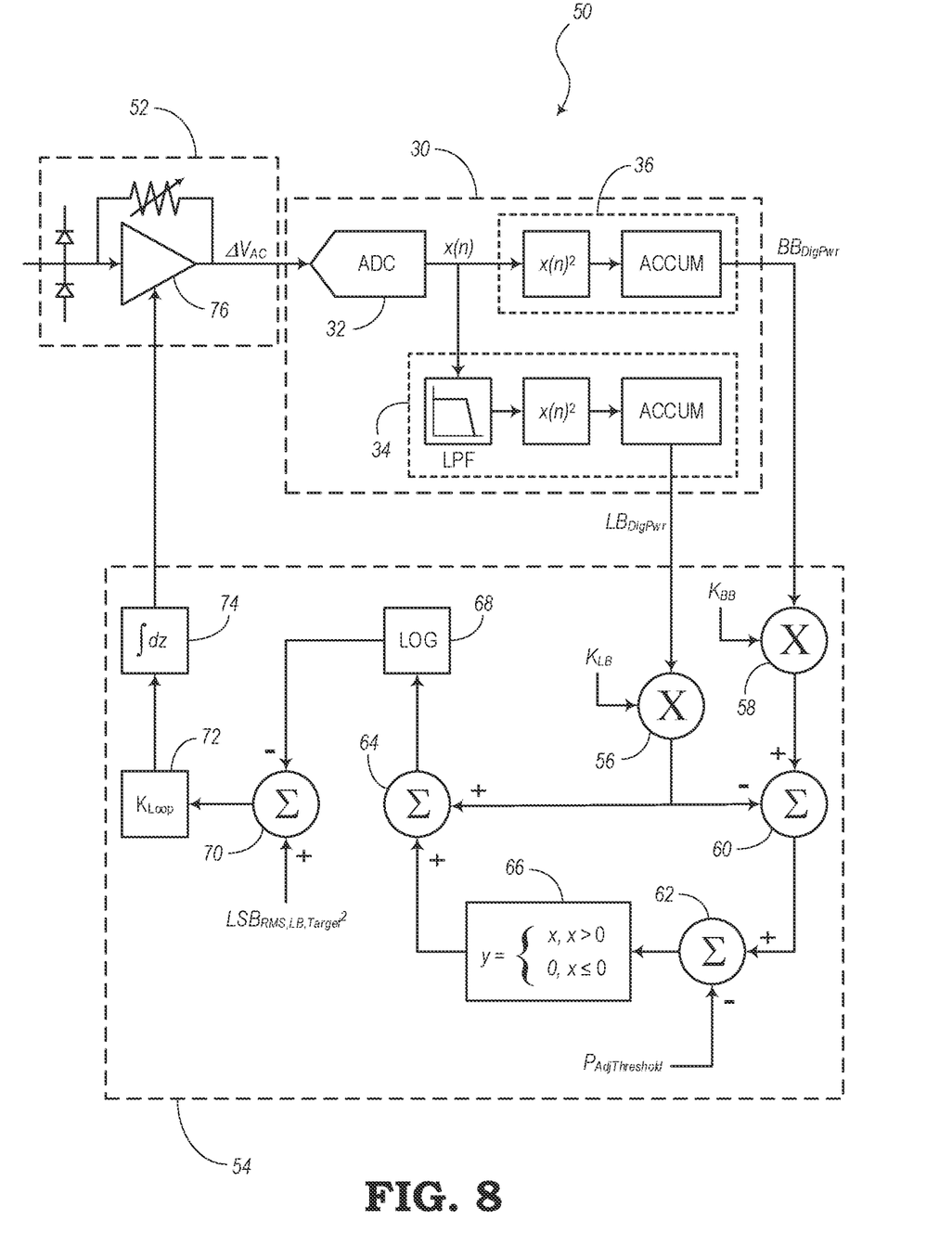
FIG. 8 is a schematic diagram showing a power detection system for detecting optical power of optical signals, according to various embodiments of the present disclosure.

FIG. 8 is a schematic diagram showing an embodiment of a power detection system 50 for detecting optical power of optical signals. In this embodiment, the power detection system 50 includes the dual path detector 30 of FIG. 4, which includes the ADC device 32, low bandwidth path 34, and broad bandwidth path 36. The power detection system 50 further includes a receiver 52 and an Automatic Gain Control (AGC) feedback path 54. The receiver 52 receives the optical signal and supplies it to the ADC device 32 of the dual path detector 30. The two outputs (i.e., LB_DigPwr and BB_DigPwr) from the low bandwidth path 34 and broad bandwidth path 36, respectively, are supplied to the AGC feedback path 54, which in turn provides a feedback signal to the receiver 52 for control. The power detection system 50 may include or may be incorporated in an optical network device, modem, optical receiver, AGC circuit, etc., of a network element or optical device of an optical network.

The LB_DigPwr signal from the low bandwidth path 34 is provided to a multiplier element 56, which multiplies the power signal by the constant $K_{LB}$. Also, the BB_DigPwr signal from the broad bandwidth path 36 is provided to a multiplier element 58, which multiplies the power signal by the constant $K_{BB}$. The output from the multiplier element 56 is subtracted from the output from the multiplier element 58 by a summer 60, which outputs a $LSB_{RMS,Adj}^2$, or "Adj_DigPwr" to a summer 62. The output of the multiplier element 56 is also applied to another summer 64. The summer 62 subtracts a $LSB_{RMS,Adj,Threshold}^2$ value from the output from summer 60 and provides an input to condition element 66. Condition element 66 provides an output of x if x is greater than zero and provides an output of 0 if x is less than or equal to zero. This output is provided to the summer 64. The summer 64 adds the output from the low bandwidth path 34 with the output from the condition element 66.

The output from the summer 64 is provided to logarithm element 68. Another summer 70 is configured to subtract the log value from the logarithm element 68 from $LSB_{RMS,LB,Target}^2$ (or LB_Target_DigPwr). This difference is provided to an element 72, which applies a constant $K_{Loop}$ and provides an output to an integrator element 74. The integrator element 74 provides an integration of the signal and applies an output as a feedback control signal to the receiver 52.

The power detection system 50 of FIG. 8 may be configured in a network element of a communication network and may be part of an optical receiver (e.g., coherent, colorless optical receiver circuit), an AGC circuit, control system, signal detection system, or other optical network device. In some embodiments, the power detection system 50 may include, in addition to a power detecting circuit, the AGC feedback path 54 configured to apply the power detection output to a receiver (e.g., receiver 52) for controlling a gain of the receiver. In some cases, the AGC feedback path 54 may be configured to discriminate between the low-band power component and the broad-band power component, whereby the broad-band power component may include an interference power of the channel adjacent to the channel of interest.

The receiver 52 may be part of the detector circuitry and may include a variable amplifier device 76. In this embodiment, the variable amplifier device 76 is placed in front of the ADC device 32 (which may be part of a DSP). In some embodiments, switchable filters may be placed in the variable amplifier device 76. Thus, if the ADC Nyquist bandwidth is wider than the signal itself, one of switchable filters can be switched into the circuit as needed. However, since a hardware design may be less flexible and may create complexity, losses, distortion, etc. in the design, it may be preferable to utilize digital processing in a DSP of the power detection system 50. The embodiments can be built with full bandwidth of the receiver 52 and have the dual path detector 30 capable to detecting power along with the AGC feedback path 54 to set the gain.

Some of the elements of the power detection system 50 may be implemented in hardware, whereas programmable filters may be implemented inside the DSP. In this way, it is possible to receive the output to get the whole signal or just the signal of interest. The broad bandwidth path 36 is always sampling, or always collecting power up to the Nyquist rate or Nyquist frequency. With the LPF at the front of the low bandwidth path 34, a filtered signal is provided to the squared and accumulated functional elements. In some embodiments, the LPF of the low bandwidth path 34 may be variable to set the cut-off frequency of the LPF as part of the control functionality of the power detection system 50 for balancing power and investigating power differences.

In the absence of a channel adjacent to the channel of interest, the AGC feedback path 54 may be configured to determine that there is no excess power and may further be configured to set the gain of the receiver based on a target power level associated with the low-band power component. In the presence of a channel adjacent to the channel of interest in which a power of the adjacent channel is less than or equal to a power of the channel of interest, the AGC feedback path 54 may be configured to determine no excess power and may be further configured to set the gain of the receiver based on a target power level associated with the low-band power component. According to a third case in which a channel adjacent to the channel of interest is present and in which a power of the adjacent channel is greater than a power of the channel of interest, the AGC feedback path 54 may be configured to determine excess power and may further be configured to reduce the gain of the receiver to prevent an overloading condition. These three cases are described in more detail below with respect to FIGS. 9-12.

Case 1: No Adjacent Channel Present

Figure 9A:
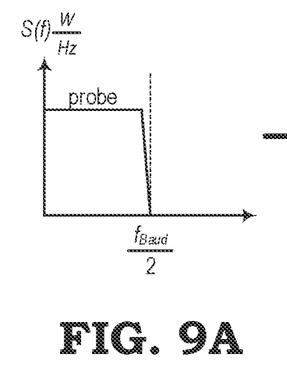
FIGS. 9A-9C show graphs of spectral density with respect to frequency as detected by the power detection system of FIG. 8 in the situation where only the channel of interest (e.g., probe channel) exists and there is no adjacent channel present, according to various embodiments.
Figure 9B:
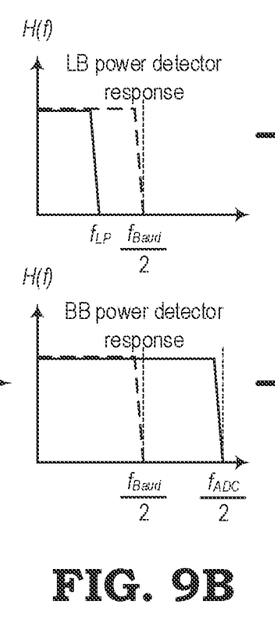
Figure 9C:
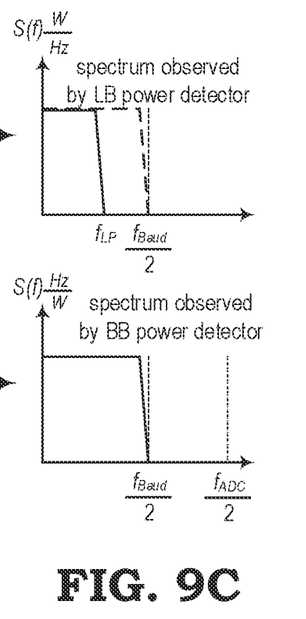

FIGS. 9A-9C show graphs of spectral density with respect to frequency as detected by the power detection system 50 of FIG. 8 in the situation where only the channel of interest (e.g., probe channel) exists and there is no adjacent channel present. Since there is no adjacent channel, $P_{BB}=P_{LB}$ and $P_{BB}-P_{LB}-P_{Adj,Threshold}<0$. Thus $P_{Excess}=0$. Since there is no adjacent channel present, the AGC sets Rx Gain such that $$P_{LB} \xLeftrightarrow{Locked} P_{LB,Target}.$$

Case 2: Adjacent Channel Present and $S_{Adjacent} \leq S_{Probe}$

Figure 10A:
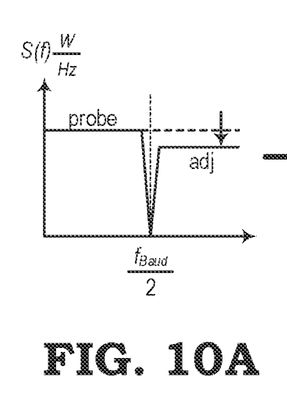
FIGS. 10A-10C show graphs of spectral density with respect to frequency as detected by the power detection system of FIG. 8 in the situation where an adjacent channel is present, according to various embodiments.
Figure 10B:
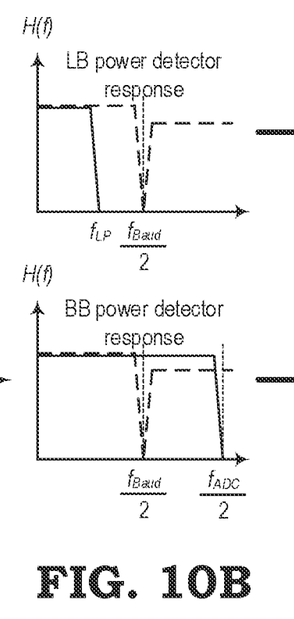
Figure 10C:
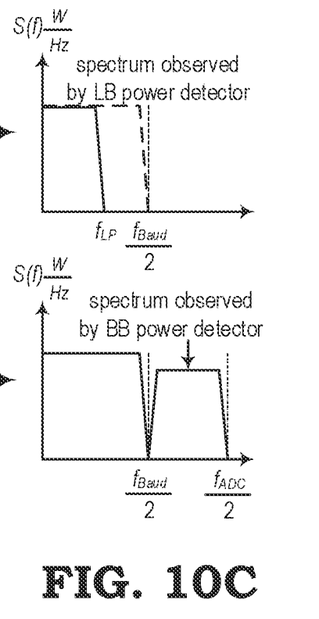

FIGS. 10A-10C show graphs of spectral density with respect to frequency as detected by the power detection system 50 of FIG. 8 in the situation where an adjacent channel is present. In addition, the spectral density of the adjacent channel is less than or equal to the spectral density of the channel of interest (or probe channel). In this example, $P_{BB}=P_{LB}+P_{Adj}$ and since $S_{Adj}(f) \leq S_{Probe}(f)$, $P_{BB}-P_{LB}-P_{Adj,Threshold} \leq 0$. Thus Thus $P_{Excess}=0$. Since $P_{Excess}=0$, the AGC sets Rx Gain such that $$P_{LB} \xLeftrightarrow{Locked} P_{LB,Target}.$$

Case 3: Adjacent Channel Present and $S_{Adjacent} > S_{Probe}$

Figure 11A:
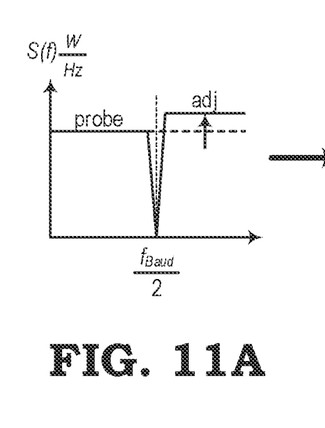
FIGS. 11A-11C show graphs of spectral density with respect to frequency as detected by the power detection system of FIG. 8 in the situation where a channel adjacent to the channel of interest is also present, according to various embodiments.
Figure 11B:
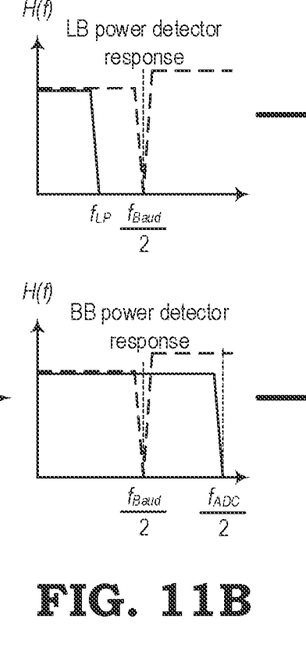
Figure 11C:
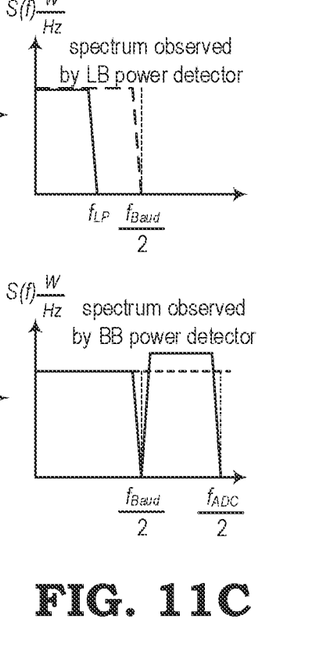

FIGS. 11A-11C show graphs of spectral density with respect to frequency as detected by the power detection system 50 of FIG. 8 in the situation where a channel adjacent to the channel of interest is also present. In addition, the spectral density of the adjacent channel is greater than the spectral density of the channel of interest (or probe channel). In this example, $P_{BB}=P_{LB}+P_{Adj}$ and since $S_{Adj}(f)>S_{probe}(f)$, $P_{BB}-P_{LB}-P_{Adj,Threshold}>0$. Thus Thus $P_{Excess}>0$. Since $P_{Excess}>0$ then $P_{Sum}=P_{LB}+P_{Excess}$, the AGC sets Rx Gain such that $$P_{LB} + P_{Excess} \xLeftrightarrow{Locked} P_{LB,Target}.$$

The AGC will set the target signal into the ADC at a level that is slightly lower to prevent overloading the ADC. This is accomplished by $$\frac{P_{LB}+P_{Adjcent}}{f_{ADC/2}} = \overline{S_{BB,Target}}.$$

Figure 12:
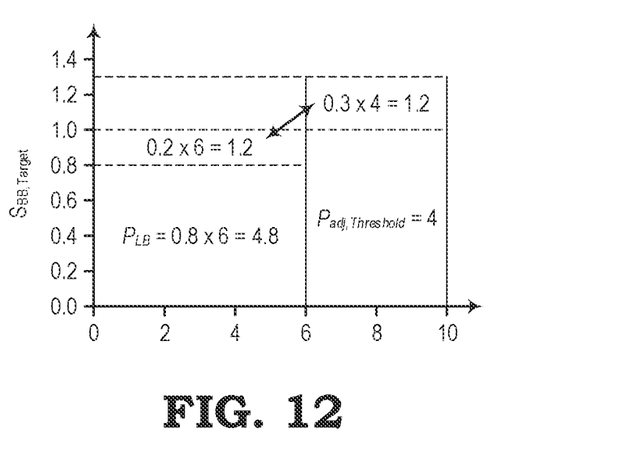
FIG. 12 is another graph based on the situation of FIGS. 11A-11C where the spectral density of the adjacent channel is greater than the spectral density of the probe channel, according to various embodiments.

FIG. 12 is another graph based on Case 3 where the spectral density of the adjacent channel is greater than the spectral density of the probe channel. In this example, $P_{BB,Target}=1 \times 10=10;$ $P_{LB,Target}=1 \times 6=6$ $P_{Adj,Threshold} = 10-6 = 4$ Under an AGC lock condition:

$P_{BB} = 4.8 + 5.2 = 10$ $P_{Excess} = 10 - 4.8 - 4 = 1.2$ $P_{Sum} = 4.8 + 1.2 = 6$ Therefore, according to the various embodiments of the present disclosure, a receiver may be provided with a low-bandwidth and broad-bandwidth power detector to detect target signal power and adjacent channel (i.e., out-of-band) power. The receiver may be configured with an AGC loop that can control the receiver gain when the adjacent channel power varies such that the ADC is not driven into clipping.

One of the problems with conventional systems is that it can be difficult to detect power with colorless optical signals. The embodiments of the present disclosure are able to overcome the issues with the conventional systems by introducing the dual path detection for detecting power of a low bandwidth portion of the spectrum including just the desired channel plus a second branch that detects power of a broad bandwidth portion of the spectrum including the desire channel and an adjacent (out-of-band) channel. A Digital Signal Processor (DSP) of an optical receiver according to the present disclosure may include a sampling frequency to detect the broadband signals. For example, if the ADC sampling frequency is about 50 G samples per second, the Nyquist bandwidth frequency will be about 25 GHz. In other words, the desired signal bandwidth may be near to the Nyquist rate. In some situations, a user may wish to use a lower Baud rate or bandwidth.

In some examples, if the sampling frequency is 50 GHz and a 20 GBaud signal is sent, the signal bandwidth may be only 10 GHz with excess bandwidth in the receiver. In a colorless receiver, the optical channels are packed close together. With an adjacent channel present, a receiver will typically see the power of this adjacent channel. Since conventional systems do not take the power of adjacent channels into consideration, problems will arise. The embodiments of the present disclosure address these issues by controlling the receiver gain in the AGC feedback loop. Also, the present implementations determine whether or not an adjacent channel is present and also determines the relative power of the adjacent channel with respect to the channel of interest (e.g., desired channel, probe channel, etc.).

In the past, one receiver was used for receiving signal. This one receiver had been replaced with different receiver modules and would depend on your transmitter. With the present disclosure, it is possible to return to the use of a single receiver again. However, instead of operating in a bandwidth in the range from about 20 GHz to 35 GHz, the receiver 52 shown in FIG. 8 may now be able to operate in the 50 GHz range. Conventional systems are not able to handle this range with a lower Baud rate signal, but the embodiments of the present disclosure are able to allow the packing of adjacent channels in the spectrum and still handle the negative consequences of the presence of these adjacent channels. The present disclosure provides a great benefit in that it is possible to have a single hardware receiver (e.g., receiver 52) for the various applications as opposed to multiple different receiver modules.

Although the present disclosure has been illustrated and described herein with reference to exemplary embodiments providing various advantages, it will be readily apparent to those of ordinary skill in the art that other embodiments may perform similar functions, achieve like results, and/or provide other advantages. Modifications, additions, or omissions may be made to the systems, apparatuses, and methods described herein without departing from the spirit and scope of the present disclosure. All equivalent or alternative embodiments that fall within the spirit and scope of the present disclosure are contemplated thereby and are intended to be covered by the following claims.

What is claimed is:

1. A power detection system comprising:
a receiver configured to receive an optical signal; and
a dual path detector including
a low bandwidth path configured to detect a low-band power component of the optical signal within a channel of interest;
a broad bandwidth path arranged in parallel with the low bandwidth path, the broad bandwidth path configured to detect a broad-band power component of the optical signal within broad-band channels including at least the channel of interest; and
an Analog-to-Digital Converter (ADC) configured to convert the received optical signal to digital signal samples, wherein the digital signal samples are applied to the low bandwidth path and the broad bandwidth path;
wherein a power detection output is derived from the low-band power component and the broad-band power component.

2. The power detection system of claim 1, further comprising an Automatic Gain Control (AGC) feedback path configured to apply the power detection output to the receiver for controlling a gain of the receiver.

3. The power detection system of claim 1, further comprising circuitry configured to discriminate between the low-band power component and the broad-band power component.

4. The power detection system of claim 1, wherein the receiver is configured to receive coherent optical signals.

5. The power detection system of claim 1, wherein the ADC is configured to sample the received optical signal at or about 50GBaud.

6. The power detection system of claim 1, wherein the low bandwidth path includes a low pass filter having a programmable cut-off frequency.

7. The power detection system of claim 1, wherein each of the low bandwidth path and broad bandwidth path includes a squaring function and an accumulating function and is configured to provide a Root Mean Squared (RMS) expression for the low-band power component and broad-band power component, respectively.

8. The power detection system of claim 1, wherein the power detection system is an optical network device that resides in a modem of an optical communication system.

9. A power detection system comprising:
a receiver configured to receive an optical signal;
a dual path detector including
a low bandwidth path configured to detect a low-band power component of the optical signal within a channel of interest; and
a broad bandwidth path arranged in parallel with the low bandwidth path, the broad bandwidth path configured to detect a broad-band power component of the optical signal within broad-band channels including at least the channel of interest; and
an Automatic Gain Control (AGC) feedback path configured to apply the power detection output to the receiver for controlling a gain of the receiver;
wherein a power detection output is derived from the low-band power component and the broad-band power component,
wherein, in the absence of a signal in a channel adjacent to the channel of interest, the AGC feedback path is configured to determine no excess power and is further configured to set the gain of the receiver based on a target power level associated with the low-band power component,
wherein, in the presence of a signal in a channel adjacent to the channel of interest in which a power of the adjacent channel is less than or equal to a power of the channel of interest, the AGC feedback path is configured to determine no excess power and is further configured to set the gain of the receiver based on a target power level associated with the low-band power component, and
wherein, in the presence of a signal in a channel adjacent to the channel of interest in which a power of the adjacent channel is greater than a power of the channel of interest, the AGC feedback path is configured to determine excess power and is further configured to reduce the gain of the receiver to prevent an overloading condition.

10. The power detection system of claim 9, further comprising circuitry configured to discriminate between the low-band power component and the broad-band power component.

11. The power detection system of claim 9, wherein the receiver is configured to receive coherent optical signals.

12. The power detection system of claim 9, wherein the dual path detector further includes an Analog-to-Digital Converter (ADC) configured to convert the received optical signal to digital signal samples, wherein the digital signal samples are applied to the low bandwidth path and the broad bandwidth path.

13. The power detection system of claim 9, wherein the low bandwidth path includes a low pass filter having a programmable cut-off frequency.

14. The power detection system of claim 9, wherein the power detection system is an optical network device that resides in a modem of an optical communication system.

15. A power detection system comprising:
a receiver configured to receive an optical signal; and
a dual path detector including
a low bandwidth path configured to detect a low-band power component of the optical signal within a channel of interest; and
a broad bandwidth path arranged in parallel with the low bandwidth path, the broad bandwidth path configured to detect a broad-band power component of the optical signal within broad-band channels including at least the channel of interest;
wherein a power detection output is derived from the low-band power component and the broad-band power component,
wherein each of the low bandwidth path and broad bandwidth path includes a squaring function and an accumulating function and is configured to provide a Root Mean Squared (RMS) expression for the low-band power component and broad-band power component, respectively.

16. The power detection system of claim 15, further comprising an Automatic Gain Control (AGC) feedback path configured to apply the power detection output to the receiver for controlling a gain of the receiver.

17. The power detection system of claim 15, further comprising circuitry configured to discriminate between the low-band power component and the broad-band power component.

18. The power detection system of claim 15, wherein the receiver is configured to receive coherent optical signals.

19. The power detection system of claim 15, wherein the dual path detector further includes an Analog-to-Digital Converter (ADC) configured to convert the received optical signal to digital signal samples, wherein the digital signal samples are applied to the low bandwidth path and the broad bandwidth path.

20. The power detection system of claim 15, wherein the low bandwidth path includes a low pass filter having a programmable cut-off frequency.

* * * * *